United States Patent
Lin

(10) Patent No.: US 8,143,121 B2
(45) Date of Patent: Mar. 27, 2012

(54) DRAM CELL WITH DOUBLE-GATE FIN-FET, DRAM CELL ARRAY AND FABRICATION METHOD THEREOF

(75) Inventor: Shian-Jyh Lin, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 308 days.

(21) Appl. No.: 12/571,443

(22) Filed: Oct. 1, 2009

(65) Prior Publication Data
US 2011/0079836 A1    Apr. 7, 2011

(51) Int. Cl.
*H01L 21/8234* (2006.01)
*H01L 21/8244* (2006.01)

(52) U.S. Cl. ........ 438/238; 257/296; 257/335; 438/257; 438/268

(58) Field of Classification Search .................. 438/238, 438/257, 268; 257/296, 335
See application file for complete search history.

(56) References Cited

U.S. PATENT DOCUMENTS

| | | | |
|---|---|---|---|
| 7,279,742 B2 | 10/2007 | Gruning-Von Schwerin | |
| 7,368,352 B2 | 5/2008 | Kim et al. | |
| 7,994,061 B2 * | 8/2011 | Jung | 438/700 |

OTHER PUBLICATIONS

Schloesser et al., Highly Scalable Sub-50nm Vertical Double Gate Trench DRAM Cell, 2004.

* cited by examiner

*Primary Examiner* — Fernando L Toledo
(74) *Attorney, Agent, or Firm* — Winston Hsu; Scott Margo

(57) ABSTRACT

A transistor structure includes a semiconductor substrate having a top surface and sidewalls extending downward from the top surface, wherein each of the sidewall comprises a vertical upper sidewall surface and a lower sidewall recess laterally etched into the semiconductor substrate. A trench fill dielectric region is inlaid into the top surface of the semiconductor substrate. Two source/drain regions are formed into the top surface of the semiconductor substrate and are sandwiched about the trench fill region. A buried gate electrode is embedded in the lower sidewall recess. A gate dielectric layer is formed on surface of the lower sidewall recess between the semiconductor substrate and the buried gate electrode.

27 Claims, 16 Drawing Sheets

DRAM CELL WITH DOUBLE-GATE FIN-FET, DRAM CELL ARRAY AND FABRICATION METHOD THEREOF

BACKGROUND OF THE INVENTION

1. Field of the Invention

The present invention relates generally to semiconductor technologies. More particularly, the present invention relates to a dynamic random access memory (DRAM) cell and array with an embedded double-gate fin-FET, and a method for fabricating such DRAM cell structure.

2. Description of the Prior Art

Currently used dynamic random access memory (DRAM) devices comprise memory cells with one transistor and one storage capacitor in series. In order to obtain a sufficiently large read signal of the DRAM memory cell, the storage capacitor has to provide a sufficient storage capacitance. On account of the limited memory cell area, storage capacitors which utilize the third dimension are therefore used. One embodiment of a three-dimensional storage capacitor is the so-called stacked capacitor, which is arranged in a manner laterally adjoining a transistor, preferably essentially above the transistor, the inner capacitor electrode being conductively connected to the transistor.

As the areas of the memory cells become smaller and smaller on account of increasing miniaturization, retaining the current driver capability of the transistor poses an increasing problem. The shrinking of the cell areas and the resultant shrinking of the transistor dimensions mean that the transistor width of the planar junction transistors decreases. This in turn has the effect of reducing the current switched through from the transistor to the storage capacitor. One possibility of retaining the current driver capability of the planar transistor with a reduced transistor width consists in correspondingly scaling the gate oxide thickness or the doping profile of the source/drain regions and of the channel region. However, there is the problem of increased leakage currents when the gate oxide thickness is reduced or the doping concentrations are higher.

As an alternative to planar DRAM selection transistors, vertically arranged transistors are increasingly being discussed in order, in the case of selection transistors, too, additionally to be able to utilize the third dimension and obtain larger transistor widths. However, vertically embodied transistors are very complicated in terms of process engineering and can be fabricated only with difficulty, in particular with regard to the connection technique of the source/drain regions and of the gate electrodes of the transistor. Further, during the operations of switching the transistor on and off, the semiconductor substrate is also concomitantly charged at the same time, and the so-called floating body effect occurs, as a result of which the switching speed of the transistor is greatly impaired.

In particular in connection with logic circuits, new junction transistor concepts are developed which can achieve a higher current intensity relative to the transistor width in comparison with the conventionally planar transistors. One possible short-channel junction transistor concept is the so-called double gate transistor, in which the channel region between source and drain regions is encompassed by a gate electrode at least on two sides, whereby a high current driver capability can be achieved even in the case of very short channel lengths since an increased channel width results in comparison with conventional planar transistors. In this case, it is preferred for the double gate transistor to be designed as a so-called fin-FET or fin-type field effect transistor, in which the channel region is embodied in the form of a fin between the source and drain regions, the channel region being encompassed by the gate electrode at least at the two opposite sides.

One prior art double gate fin-FET with floating body issue is described in a published paper entitled "Highly Scalable Sub-50 nm Vertical Double Gate Trench DRAM Cell", Schloesser, T. Manger, D. Weis, R. Slesazeck, S. Lau, F. Tegen, S. Sesterhenn, M. Muemmler, M. Nuetzel, J. Temmler, D. Kowalski, B. Scheler, U. Stavrev, M. Koehler, D., Memory Dev. Center, Infineon Technol., Dresden, Germany; Electron Devices Meeting, 2004.

However, the conventional DRAM device with double gate fin-FET have drawbacks including complexity of the manufacturing processes, floating body effect and insufficient source/drain contact area that leads to high contact/junction resistance and reduced performance.

Therefore, there is a strong need in this industry to provide an improved DRAM cell structure with a double gate fin-FET and DRAM cell array capable of eliminating the prior art problems, as well as a method for fabricating such DRAM cell structure and DRAM cell array. The fabrication method should be less complex and should be more litho friendly, which can alleviate the problems encountered in the conventional process.

SUMMARY OF THE INVENTION

It is therefore the primary objective to provide an improved DRAM cell structure, DRAM cell array and a fabrication method thereof in order to solve the above-mentioned prior art problems.

According to one embodiment of the claimed invention, a method for fabricating a memory cell array includes: providing a semiconductor substrate having thereon a pad oxide layer and a pad nitride layer; forming a plurality of first and second line-shaped trenches in parallel to one another in the semiconductor substrate; filling the first and second line-shaped trenches with first trench fill dielectric; forming a plurality of third line-shaped trenches into the semiconductor substrate, wherein the third line-shaped trenches are substantially perpendicular to the first and second line-shaped trenches, thereby forming a plurality of top silicon islands; forming a spacer on each sidewall of the top silicon islands; etching, in a self-aligned manner, deep trenches into the semiconductor substrate through the third line-shaped trenches; etching a lower portion of each of the deep trenches to form a fin channel structure under each of the top silicon islands and a sidewall recess under the spacer; forming a gate dielectric layer on interior surface of the lower portion of each of the deep trenches; forming a sidewall buried word line inlaid in the sidewall recess; filling the deep trenches with second trench fill dielectric; stripping the pad nitride layer to form a plurality of recessed implant windows; implanting dopants into the top silicon islands through the recessed implant windows, to thereby form source/drain regions; removing the pad oxide layer; and forming bit lines and storage capacitors electrically connecting to corresponding said source/drain regions.

In one aspect, in accordance with another embodiment, a transistor structure includes a semiconductor substrate having a top surface and sidewalls extending downward from the top surface, wherein each of the sidewall comprises a vertical upper sidewall surface and a lower sidewall recess laterally etched into the semiconductor substrate; a trench fill dielectric region inlaid into the top surface of the semiconductor substrate; two source/drain regions formed into the top surface of the semiconductor substrate and being sandwiched about the trench fill region; a channel region located around a bottom of the trench fill dielectric region between the two source/drain regions; a buried gate electrode embedded in the lower sidewall recess for controlling the channel region; and a gate dielectric layer formed on surface of the lower sidewall recess between the semiconductor substrate and the buried gate electrode.

From another aspect of this invention, a memory cell includes a stack type storage capacitor for storing electrical charge; and a selection transistor comprising the transistor structure of claim 1 connected in series with the storage capacitor, wherein one the source/drain regions is connected to the storage capacitor and the other of the source/drain regions is connected to a bit line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 1 to FIG. 15 are schematic diagrams showing a method for fabricating a DRAM cell and array with an embedded double-gate fin-FET and line-shaped buried word line configuration, wherein:

FIG. 1 is a cross-sectional view of a semiconductor substrate having thereon a pad oxide layer and a pad nitride layer;

FIG. 2 is a cross-sectional view of the semiconductor substrate after the formation of various trenches and after trench fill;

FIG. 2 is taken along line I-I' of FIG. 2A;

FIG. 3 is a top view of the semiconductor substrate after the formation of line-shaped photoresist patterns;

FIG. 4 is a top view of the semiconductor substrate showing a plurality of line-shaped trenches and a plurality of top silicon islands;

FIG. 5 is a top view of the semiconductor substrate after the formation of spacer on sidewall of the top silicon islands;

FIG. 6 is a top view of the semiconductor substrate after the formation of buried word line (BWL) trenches;

FIG. 7 is a schematic, perspective view of the semiconductor substrate after the formation of sidewall recess, fin channel structure and bottle-shaped BWL trench;

FIG. 8 is a schematic, perspective view of the semiconductor substrate after the formation of gate dielectric layer and sidewall buried word line;

FIG. 9 is a schematic, perspective view of the semiconductor substrate after the trench fill dielectric filling into the BWL trench;

FIG. 10 is a schematic, perspective view of the semiconductor substrate after the pad nitride layer strip and the formation of the heavily doped diffusion contact region in the top silicon island;

FIG. 11 is a schematic, perspective view of the semiconductor substrate after the selective epitaxial silicon growth process; and FIG. 12 to FIG. 15 are schematic diagrams showing the formation of capacitor contact pillar, bit line and storage capacitor.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 1:
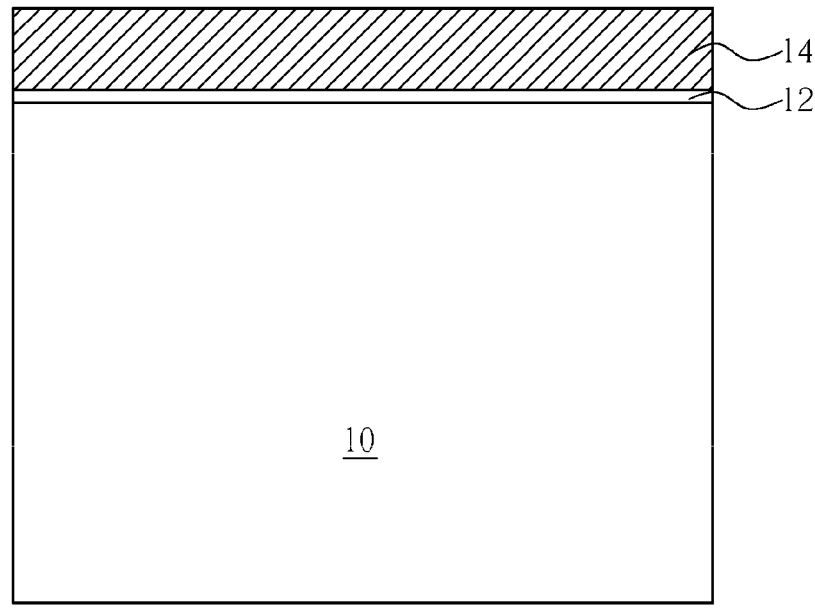

Referring initially to FIG. 1, a semiconductor substrate 10 is provided. On the main surface of the semiconductor substrate 10, a pad oxide layer 12 is formed by methods known in the art such as oxidation or deposition methods. A pad nitride layer 14 is then deposited on the pad oxide layer 12 in a blanket fashion by methods known in the art such as chemical vapor deposition (CVD) methods. The semiconductor substrate 10 may comprise single crystal silicon substrates, compound semiconductor substrates such as SiGe substrate, silicon-on-insulator (SOI) substrates, or the like. The pad oxide layer 12 may comprise silicon oxide. The pad nitride layer 14 may comprise silicon nitride. It is understood that the pad oxide layer 12 and pad nitride layer 14 may be replaced with other suitable materials which provide high etching selectivity with respect to the silicon substrate, for example, polysilicon, photoresist, etc.

Figure 2:
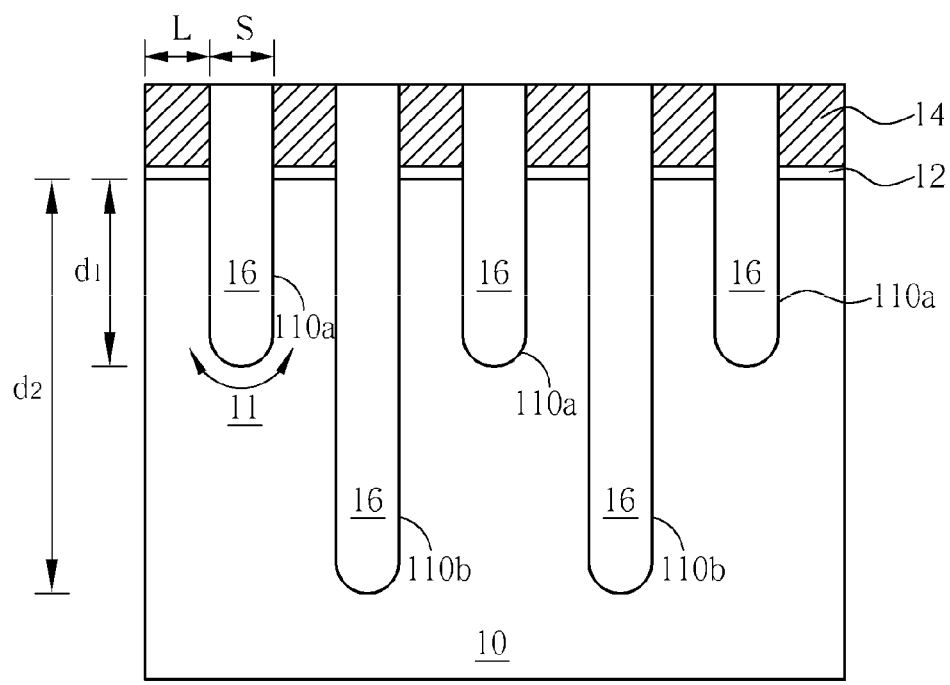
Figure 2A:
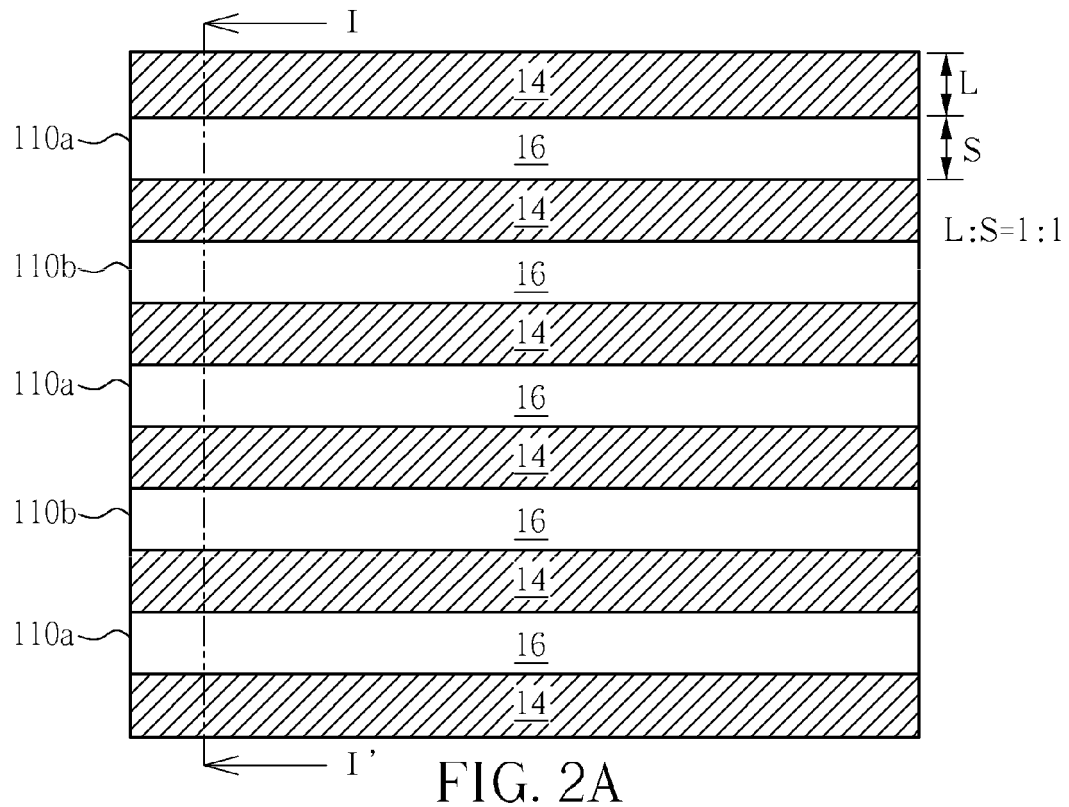
FIG. 2A is a top view of the semiconductor substrate after the formation of trenches and trench fill.

Referring to FIG. 2 and FIG. 2A, a plurality of line-shaped trenches 110a and 110b in parallel to one another are formed in the semiconductor substrate 10 by conventional lithographic and etching methods, wherein the line-shaped trenches 110a is shallower than the line-shaped trenches 110b. The shallower trenches 110a and the deeper trenches 110b are alternately arranged, that is, one shallower trench 110a is disposed between two deeper trenches 110b, wherein the deeper trenches 110b act as cell insulator trenches for electrically isolating cell rows. After the formation of the plurality of line-shaped trenches 110a and 110b, trench fill dielectric 16 such as silicon oxide is deposited into the trenches 110a and 110b. The trench fill dielectric 16 has a top surface that is flush with the top surface of the pad nitride layer 14.

The regular line/space pattern at ground rule of the plurality of line-shaped trenches 110a and 110b is shown in FIG. 2A, while FIG. 2 is taken along line I-I' of FIG. 2A. According to the embodiment, the line width to space ratio is substantially 1:1 (L:S=1:1). According to the embodiment, the line width L is 0.5F where represents the minimum feature size of the semiconductor device to be formed. As shown in FIG. 2, the line-shaped trenches 110a are etched into the semiconductor substrate 10 with an aspect ratio of approximately 5:1. For example, the depth d1 of each of the line-shaped trenches 110a is about 80 nm below the main surface of the semiconductor substrate 10 and the width of each of the line-shaped trenches 110a is about 16 nm. Of course, the depth d1 of each of the line-shaped trenches 110a is adjustable according to the device requirements. The line-shaped trenches 110b act as trench isolation regions between DRAM cells. For example, the depth d2 of each of the line-shaped trenches 110b is about 200 nm. A curve-like channel region 11 is defined around the bottom of the line-shaped trenches 110a and its effective channel length is determined by the depth d1 of the line-shaped trenches 110a. It is to be understood that the trenches 110a are for isolation purposes only. The channel region 11 is not necessary to be in curve-like shape. It can be any other shapes when the increase or decrease of the channel length is needed for specific device design.

Figure 3:
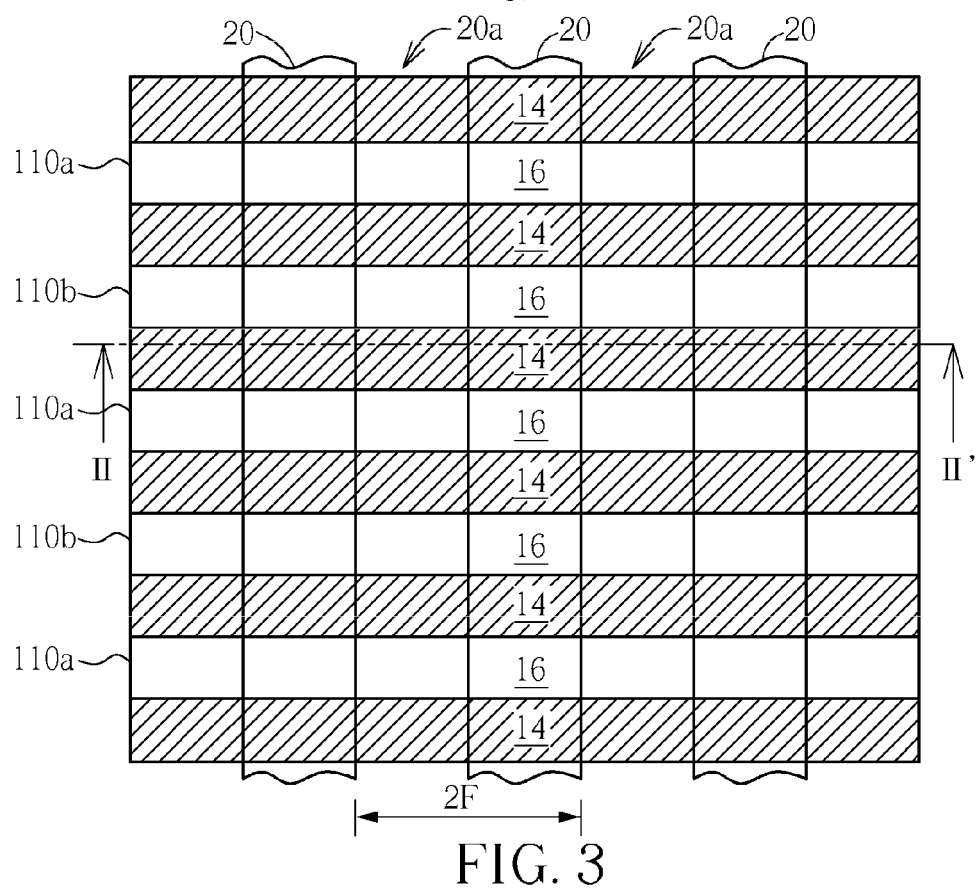
Figure 3A:
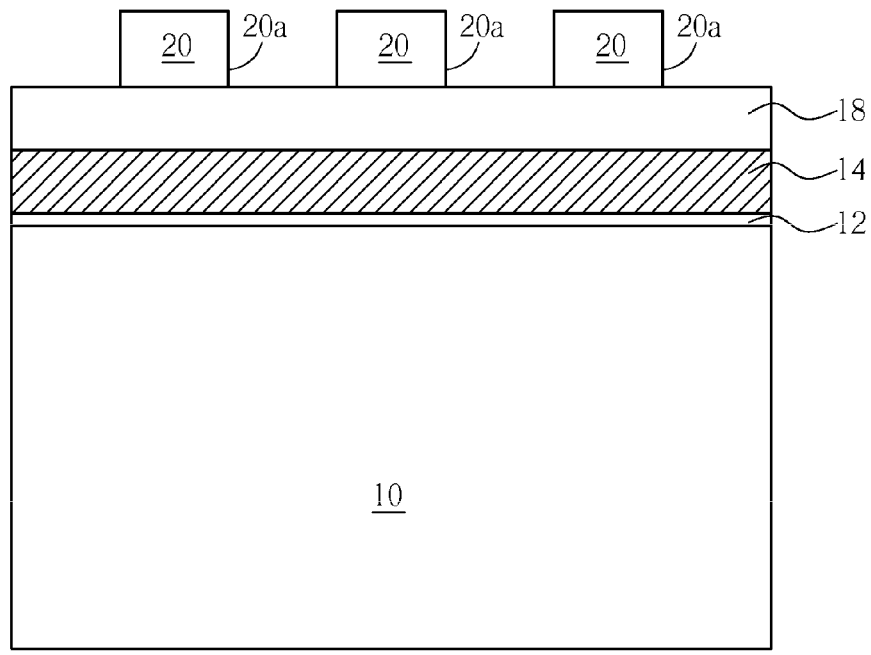
FIG. 3A is a cross-sectional view taken along line II-II' of FIG. 3.

Referring to FIG. 3 and FIG. 3A, a hard mask layer 18 such as a carbon layer is deposited over the semiconductor substrate 10 in a blanket fashion. A plurality of line-shaped photoresist patterns 20 are formed on the hard mask layer 18. The plurality of line-shaped photoresist strip patterns 20 are substantially perpendicular to the direction of the plurality of line-shaped trenches 110a and 110b. The cross-section depicted in FIG. 3A is taken along line II-II' of FIG. 3. The plurality of line-shaped photoresist patterns 20 define a plurality of line-shaped openings 20a. According to the embodiment, the width of each of the line-shaped photoresist patterns 20 is 1F and the width of each of the line-shaped openings 20a is 1F.

Figure 4:
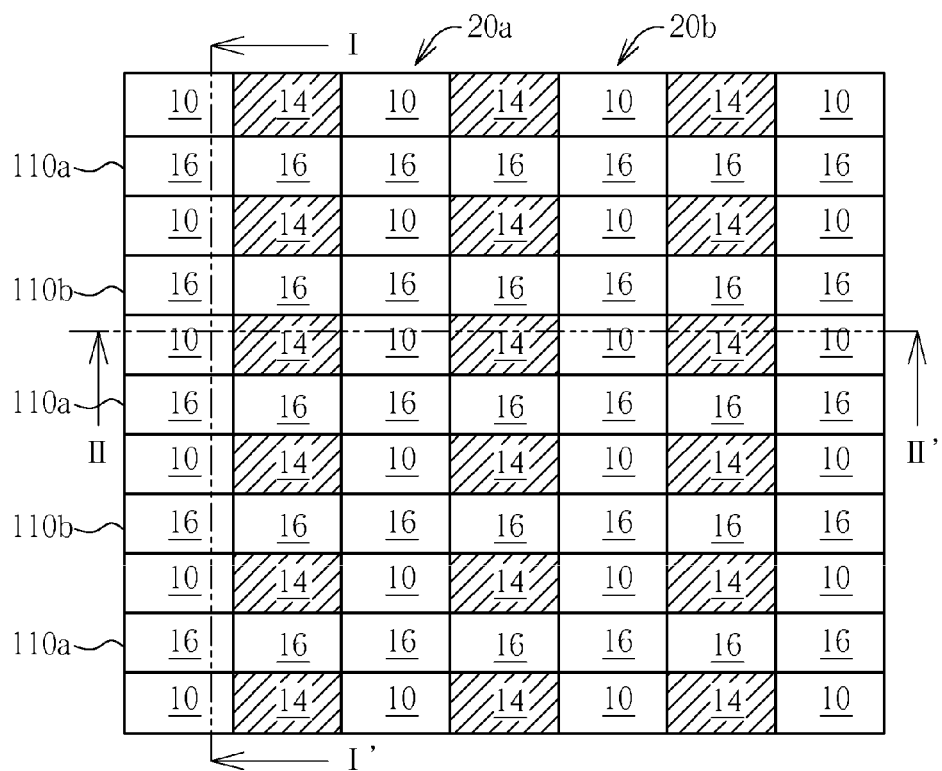
Figure 4A:
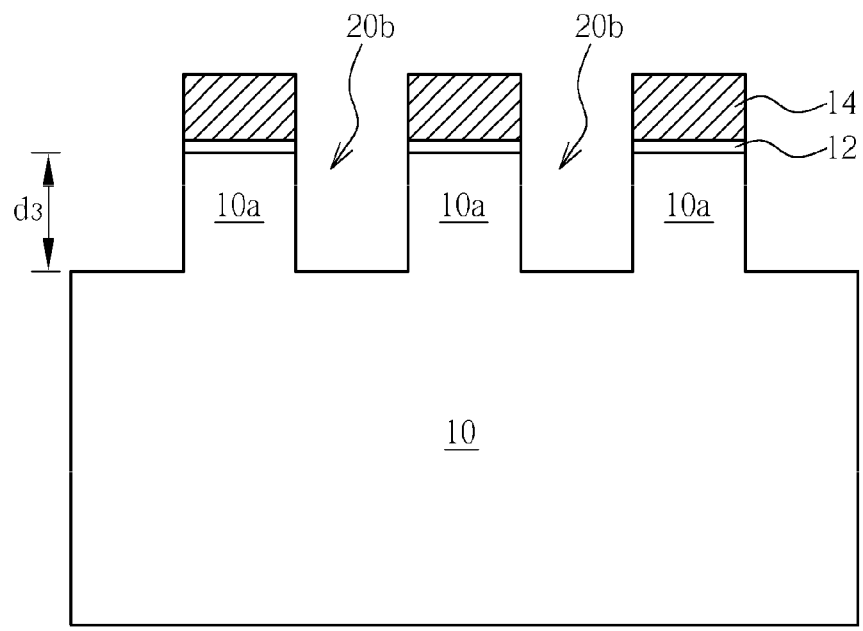
FIG. 4A is a cross-sectional view taken along line II-II' of FIG. 4.
Figure 4B:
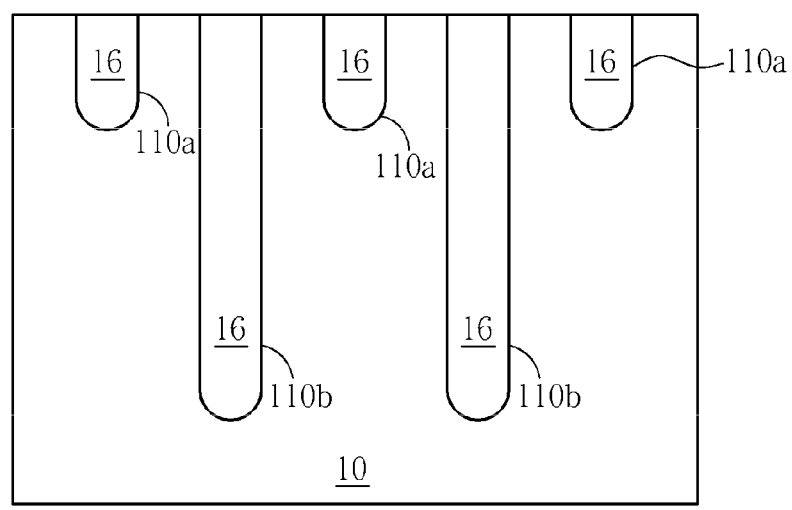
FIG. 4B is a cross-sectional view taken along line I-I' of FIG. 4.

Referring to FIGS. 4, 4A and 4B, subsequently, a plurality of line-shaped trenches 20b are etched into the semiconductor substrate 10 through the plurality of line-shaped openings 20a by anisotropic dry etching methods thereby forming a plurality of top silicon islands 10a. For example, the line-shaped trench patterns are transferred into the hard mask layer 18, the photoresist patterns 20 is then stripped, and the line-shaped trench patterns 20b are transferred into the pad nitride layer 14, pad oxide layer 12 and semiconductor substrate 10. During the dry etching process, the etching rate of the semiconductor substrate 10 is substantially equal to that of the trench fill dielectric 16 such that each of the line-shaped trenches 20b has a substantially flat bottom, as shown in FIG. 4B, which is taken along line I-I' of FIG. 4. According to the embodiment, the depth d3 of the line-shaped trenches 20b is about 50 nm below the main surface of the semiconductor substrate 10.

Figure 5:
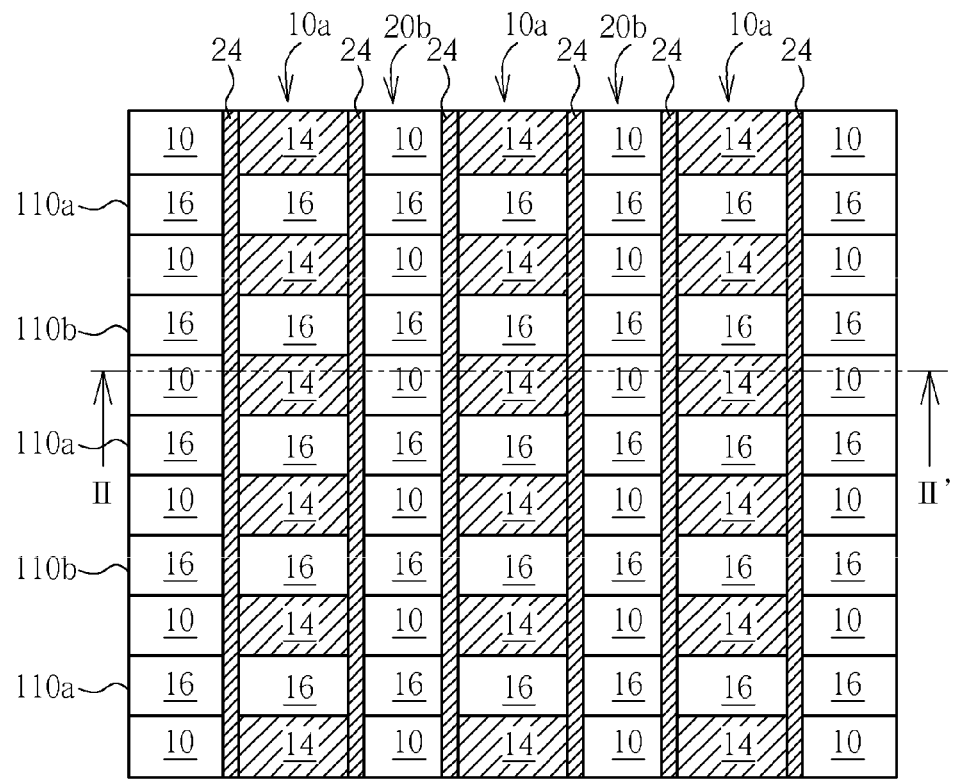
Figure 5A:
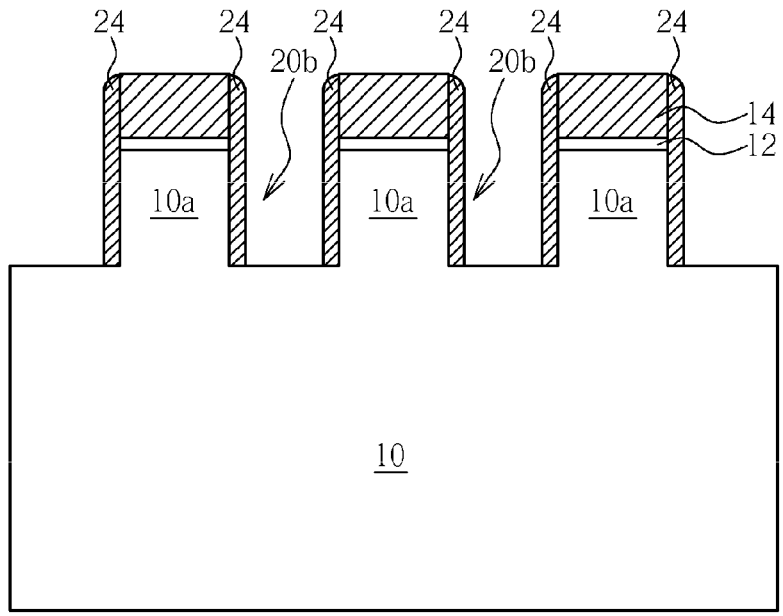
FIG. 5A is a cross-sectional view taken along line II-II' of FIG. 5.

Referring to FIGS. 5 and 5A, a spacer 24 is formed on each sidewall of the top silicon islands 10a. According to the embodiment of the invention, preferably, the spacer 24 is a silicon nitride spacer. However, other dielectric materials known in the art may be used. To form the silicon nitride spacer, for example, a conformal silicon nitride layer is first deposited over the semiconductor substrate 10, a dry etching process is then performed to etch the silicon nitride layer. FIG. 5A is a cross-sectional view taken along line II-II' of FIG. 5.

Figure 6:
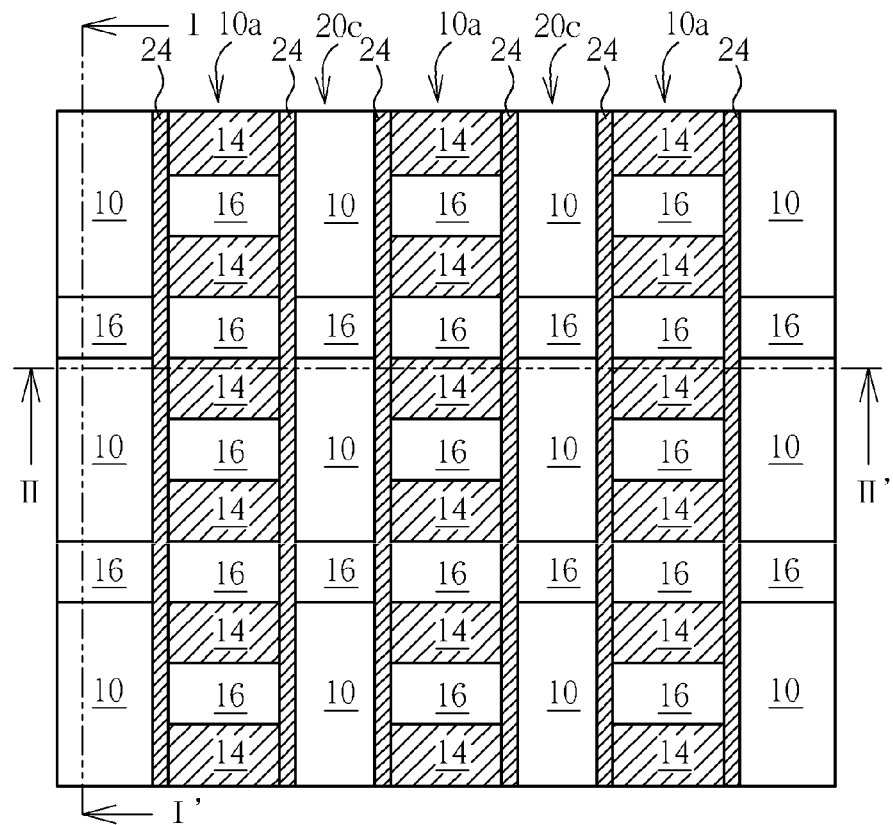
Figure 6A:
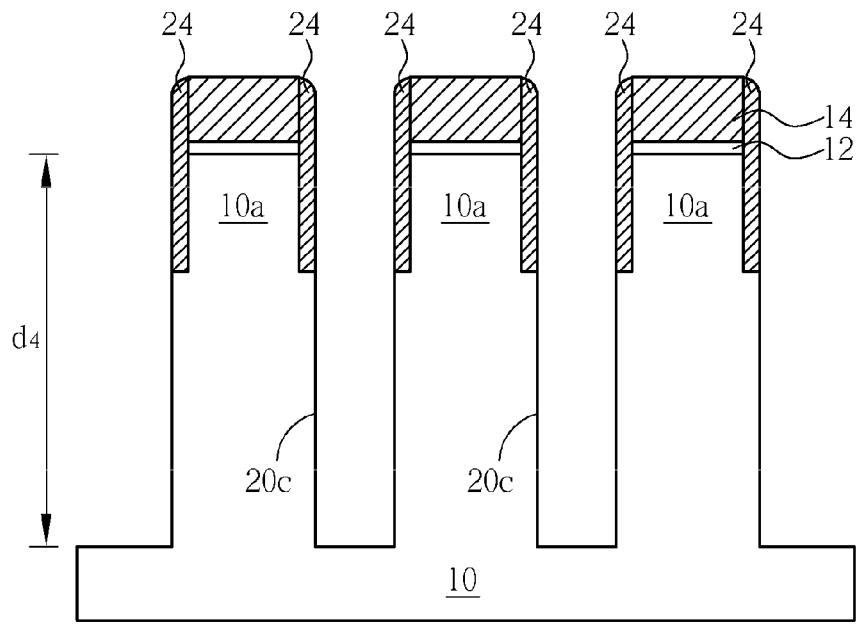
FIG. 6A is a cross-sectional view taken along line II-II' of FIG. 6.
Figure 6B:
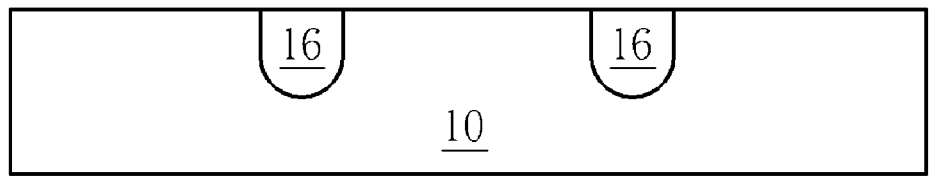
FIG. 6B is a cross-sectional view taken along line I-I' of FIG. 6.

Referring to FIGS. 6, 6A and 6B, line-shaped deep trenches 20c are etched into the semiconductor substrate 10 through the line-shaped trenches 20b by anisotropic dry etching process that is performed self-aligned with the sidewall of the spacer 24. Likewise, during the dry etching process, the etching rate of the semiconductor substrate 10 is substantially equal to that of the trench fill dielectric 16, that is, the semiconductor substrate 10 and the trench fill dielectric 16 are etched at the same time and at approximately the same etching rate. FIG. 6A is a cross-sectional view taken along line II-II' of FIG. 6. FIG. 6B is a cross-sectional view taken along line I-I' of FIG. 6. According to the embodiment of the invention, the depth d4 of the deep trenches 20c is about 180 nm, for example.

Figure 7:
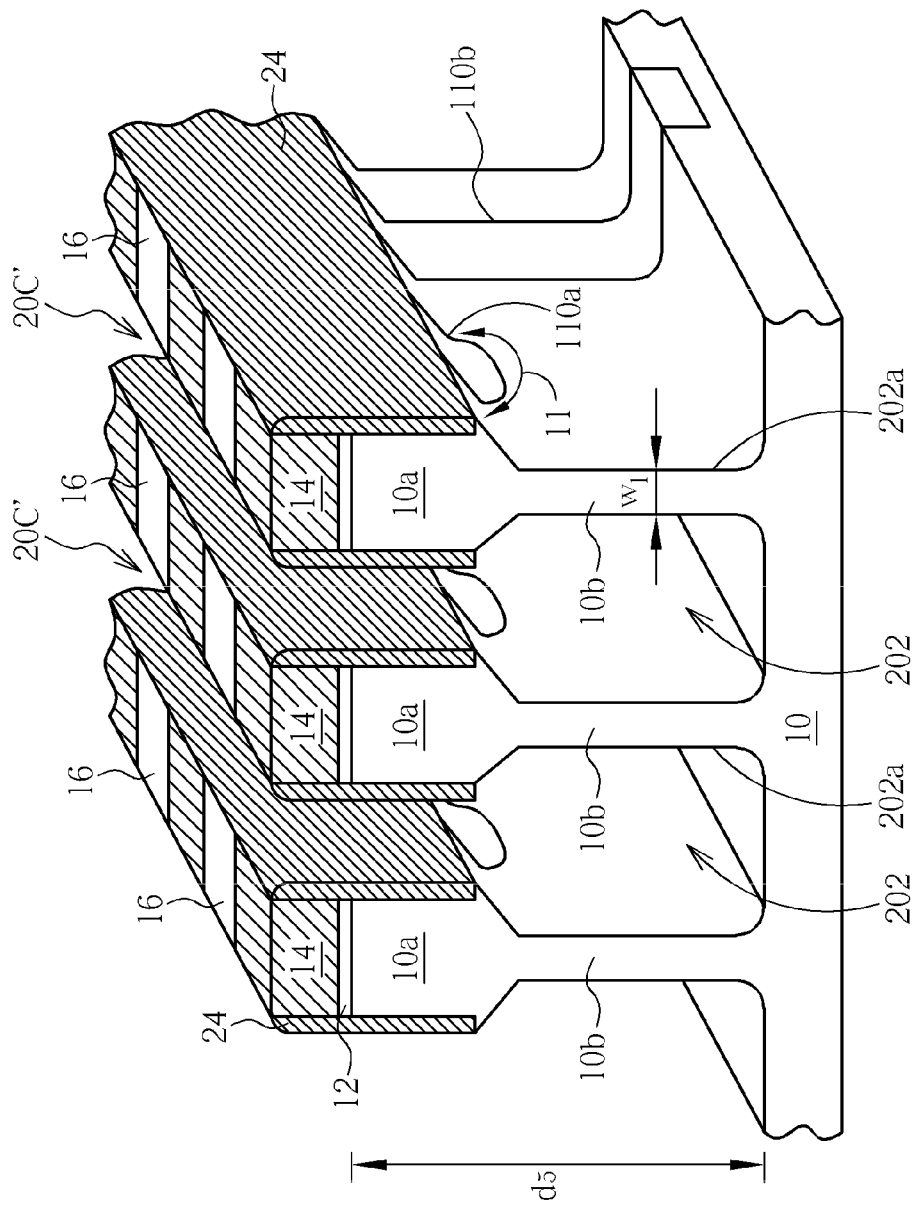

Referring to FIG. 7, a wet etching process is carried out to widen the width of the lower portion of the deep trenches 20c below the spacer 24. For example, a chemical dry etching (CDE) process utilizing $NH_4OH$ and KOH can be used to etch the semiconductor substrate 10 and the trench fill dielectric 16 at the same time, thereby forming a fin channel structure 10b that is directly under each of the top silicon islands 10a, and a bottle-shaped deep trench 20c' comprising a widened lower portion 202 and sidewall recesses 202a. Each of the sidewall recesses 202a is approximately situated directly under the spacer 24. According to the embodiment of the invention, at least 10 nm thick sidewalls of the deep trenches 20c below the spacer 24 is laterally etched away (or pull back) in order to form the fin channel structure 10b having a fin channel width w1 of about 20 nm. The depth d5 of the bottle-shaped deep trenches 20c' is now deeper, coming to about 190-200 nm, for example.

It is one feature of the invention that the transistor has thin silicon channel and the fin channel width w1 can be determined by wet etching. It is another feature that the transistor of the claimed invention has maximized contact area, hence lower contact resistance. It is still another feature that the transistor of the claimed invention has deeper junction for providing adjustable process window for gate-induced drain leakage (GIDL) reduction.

Figure 8:
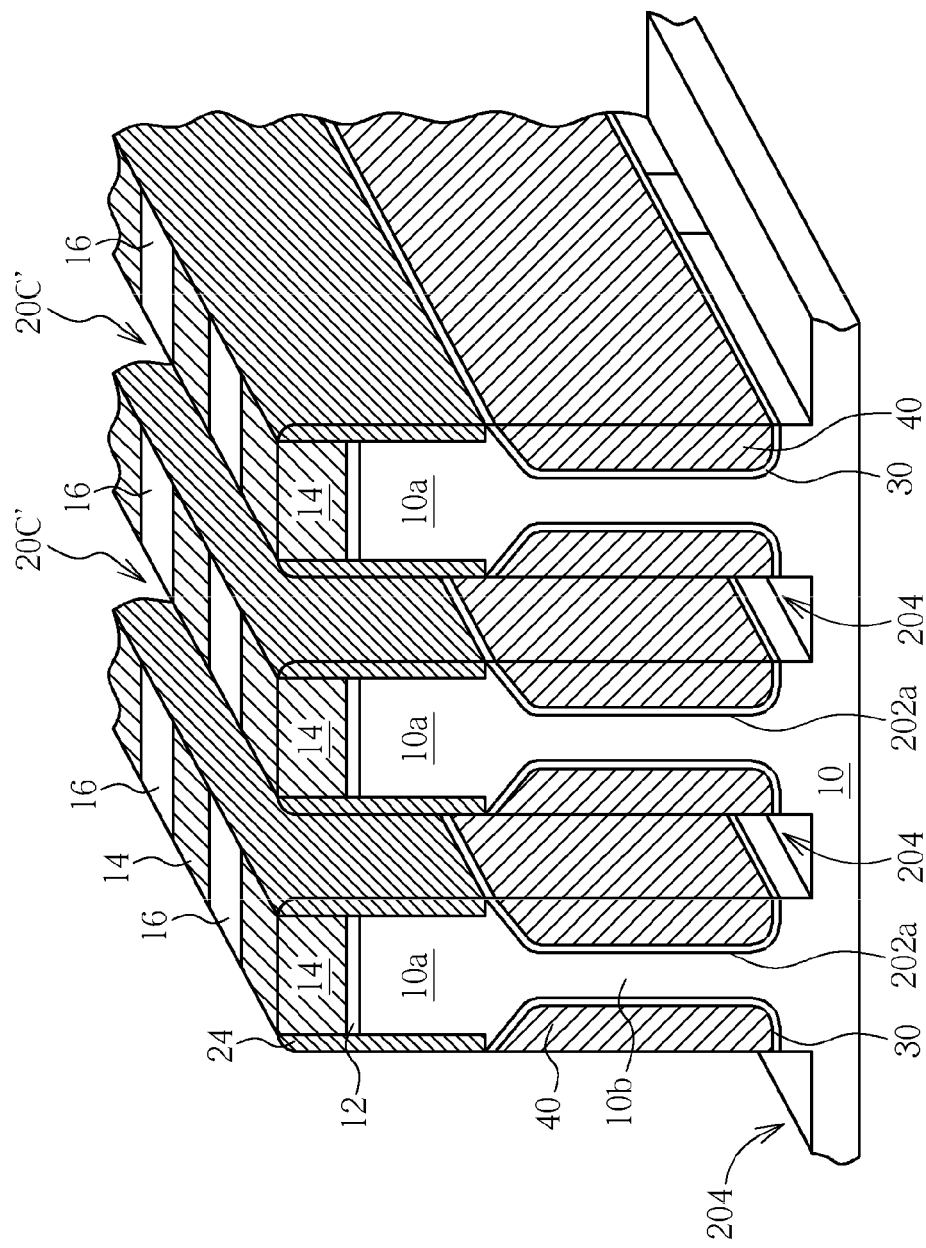

Referring to FIG. 8, a gate dielectric layer 30 is then formed on the exposed silicon surface within the bottle-shaped deep trench 20c', particularly on the surface of the lower portion 202 and sidewall recesses 202a of the bottle-shaped deep trench 20c'. For example, the gate dielectric layer 30 may be formed by low-pressure radical oxidation (LPRO) methods, high-temperature oxide (HTO) deposition methods or any suitable methods known in the art. After the formation of the gate dielectric layer 30, a conformal conductor layer (not explicitly shown) is deposited and then dry etched back to form sidewall gate electrodes or sidewall buried word lines 40 inlaid in the sidewall recesses 202a. According to the embodiment of the invention, preferably, the sidewall buried word line 40 comprises Ti, TiN, Ta, TaN, W, Cu or alloys thereof. The two sidewall buried word lines 40 in neighboring deep trenches 20c' respectively are sandwiched about the fin channel structure 10b and may act as front gate and back gate of the double-gate fin-FET of a DRAM cell. During the formation of the sidewall gate electrodes or sidewall buried word lines 40, an over-etching may be optionally performed to form a bottom recess 204 to alleviate or eliminate buried word line disturb and potential leakage problem.

Figure 9:
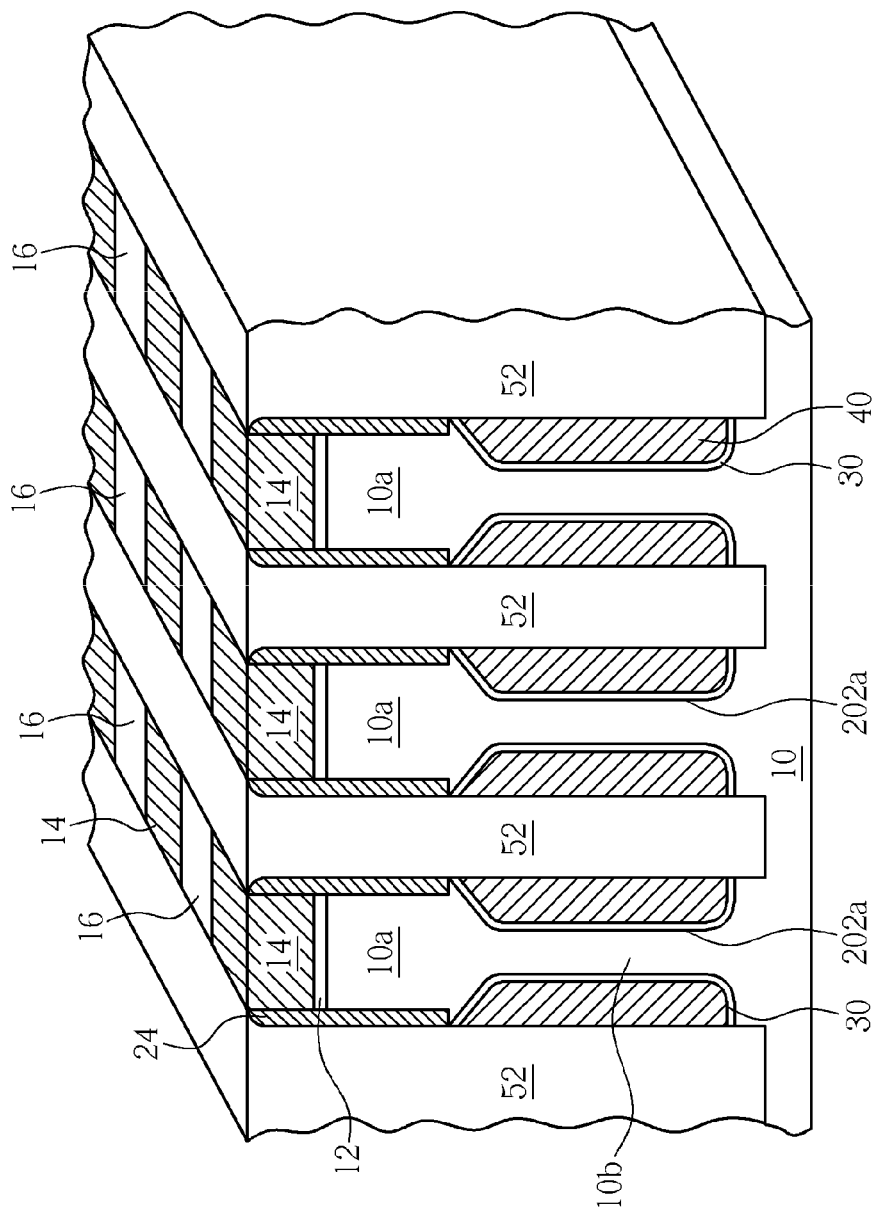

Referring to FIG. 9, a trench fill process is carried out to fill the bottle-shaped deep trench 20c' with trench fill dielectric 52 such as silicon oxide. For example, the trench fill dielectric 52 may be spin-on-dielectric (SOD) oxide. A chemical mechanical polishing (CMP) process may be used to provide a planar topography such that the top surface of the trench fill dielectric 52 is approximately flush with the top surface of the pad nitride layer 14.

Figure 10:
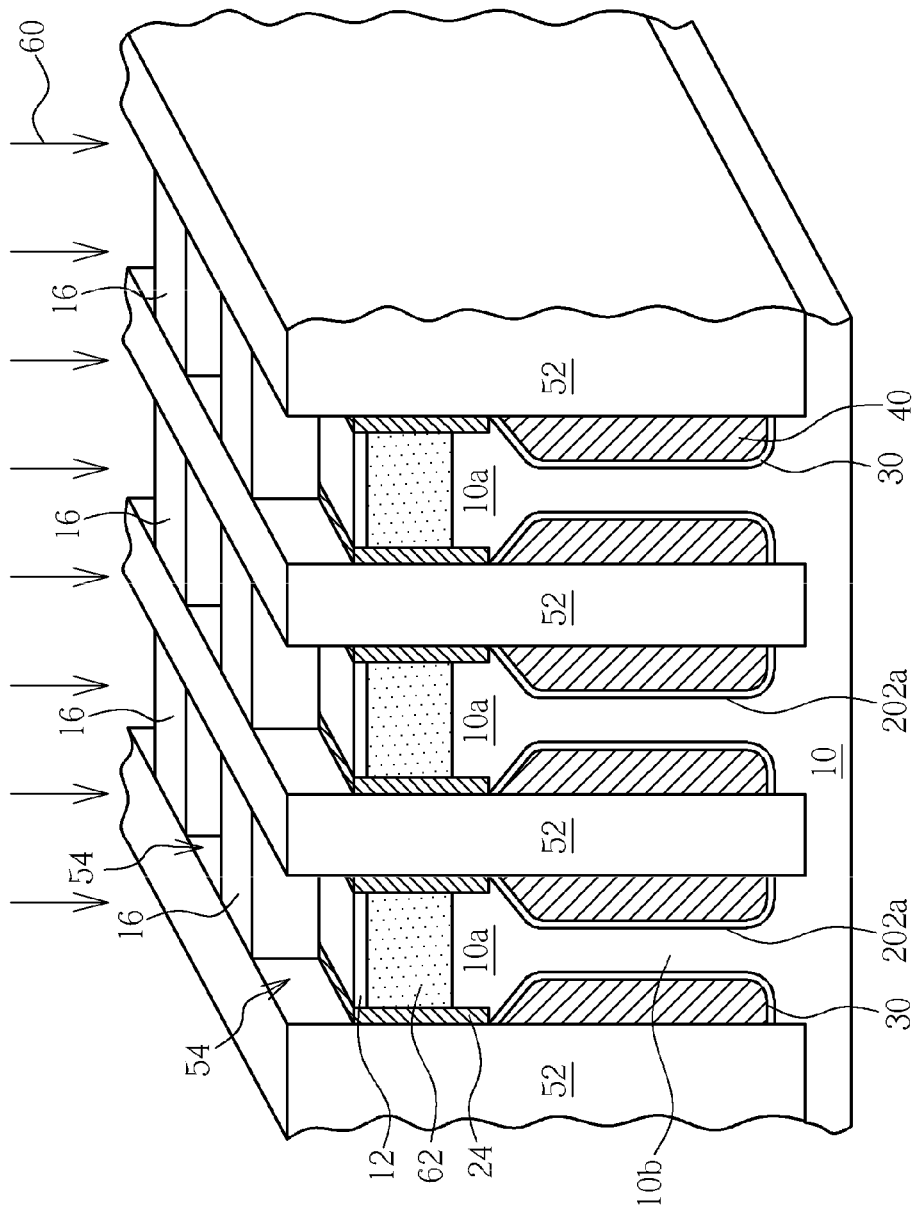

Referring to FIG. 10, after the trench fill process, the pad nitride layer 14 and an upper portion of the spacer 24 are stripped off by methods known in the art, to thereby form a plurality of recessed implant windows 54 directly above the isolated top silicon islands 10a. After the removal of the pad nitride layer 14, an ion implantation process 60 is carried out to implant dopants such as phosphorous or arsenic into the isolated top silicon islands 10a through the recessed implant windows 54 in a self-aligned fashion, to thereby form a heavily doped diffusion contact region 62 at the upper portion of each of the isolated top silicon islands 10a. The heavily doped diffusion contact region 62 may act as a source or drain of the DRAM cell.

Figure 11:
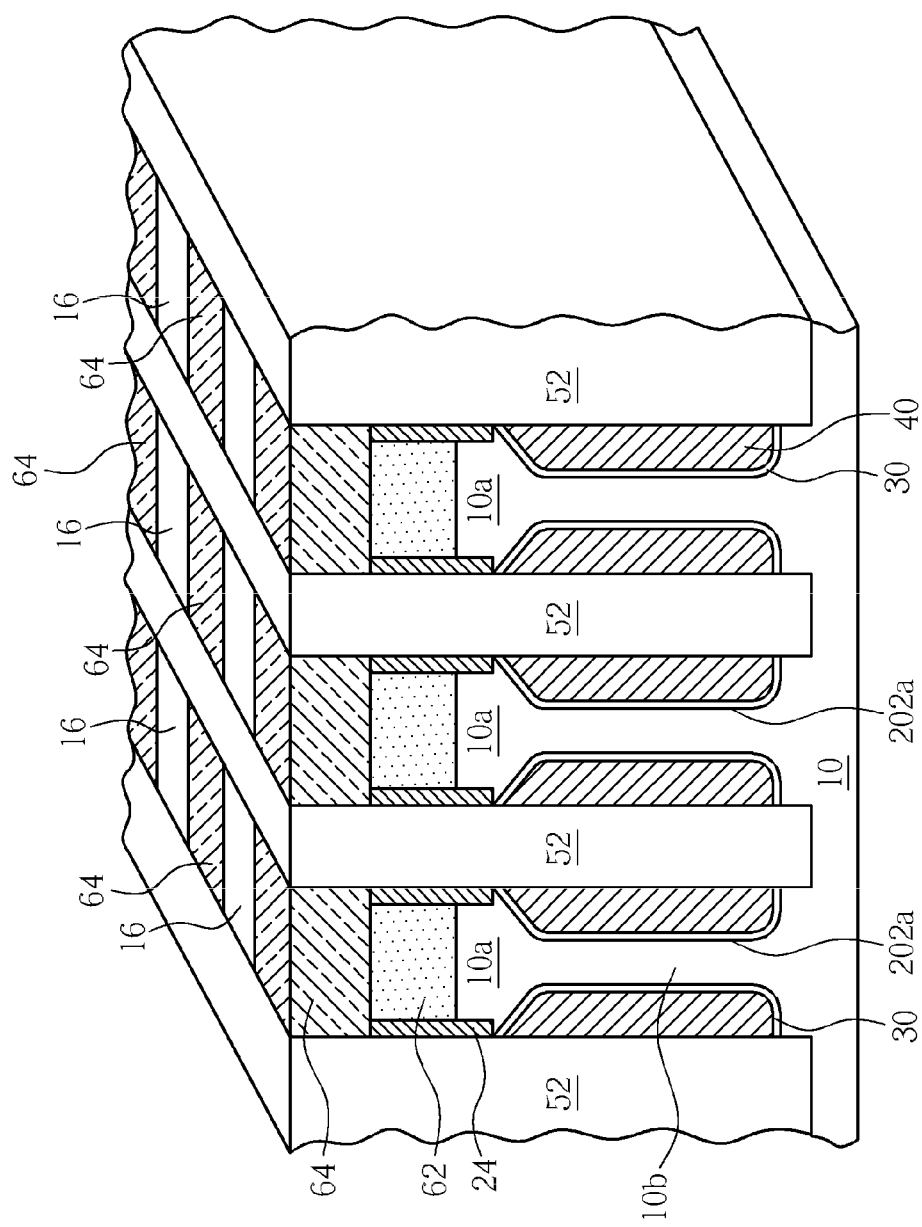

Referring to FIG. 11, after the ion implantation process 60, the pad oxide layer 12 is then removed to expose a top surface of the heavily doped diffusion contact region 62. A selective epitaxial silicon growth process is then carried out to grow epitaxial silicon layer 64 atop each of the isolated top silicon islands 10a. Optionally, the selective epitaxial silicon growth process may be carried out concurrently with the epitaxial silicon growth in the periphery source/drain area. The epitaxial silicon layer 64 may be doped epitaxial silicon.

Figure 12:
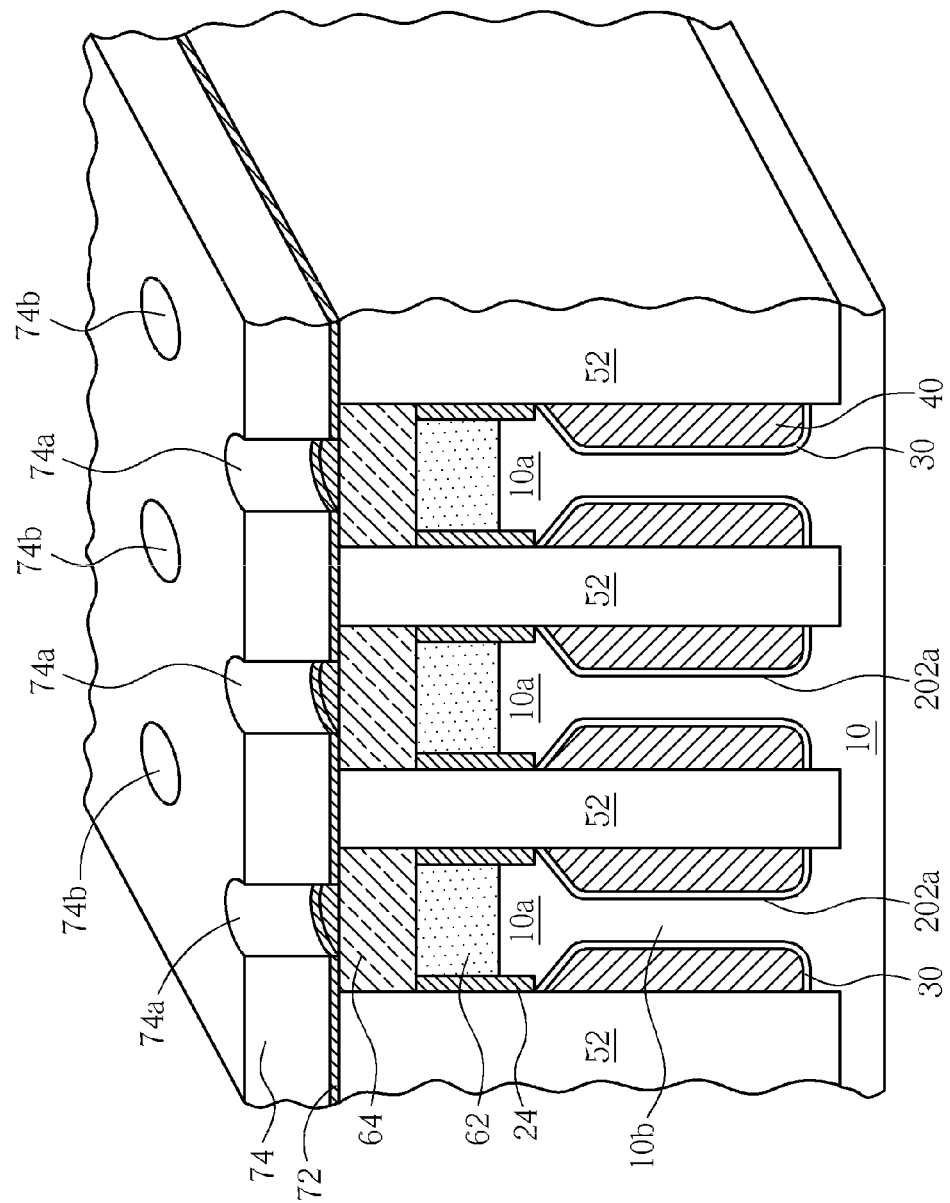

Referring to FIG. 12, after the selective epitaxial silicon growth process, a liner layer 72 such as a silicon nitride layer is deposited over the semiconductor substrate 10 in a blanket manner. The liner layer 72 may be formed by chemical vapor deposition (CVD) methods. After the formation of the liner layer 72, a dielectric layer 74 such as silicon oxide layer or phosphosilicate glass (PSG) is deposited thereon. A conventional lithographic and etching process is then carried out to form a plurality of capacitor contact openings 74a and bit line contact openings 74b into the dielectric layer 74 and the underlying liner layer 72 to thereby expose a portion of the epitaxial silicon layer 64 in each of the openings 74a and 74b.

Figure 13:
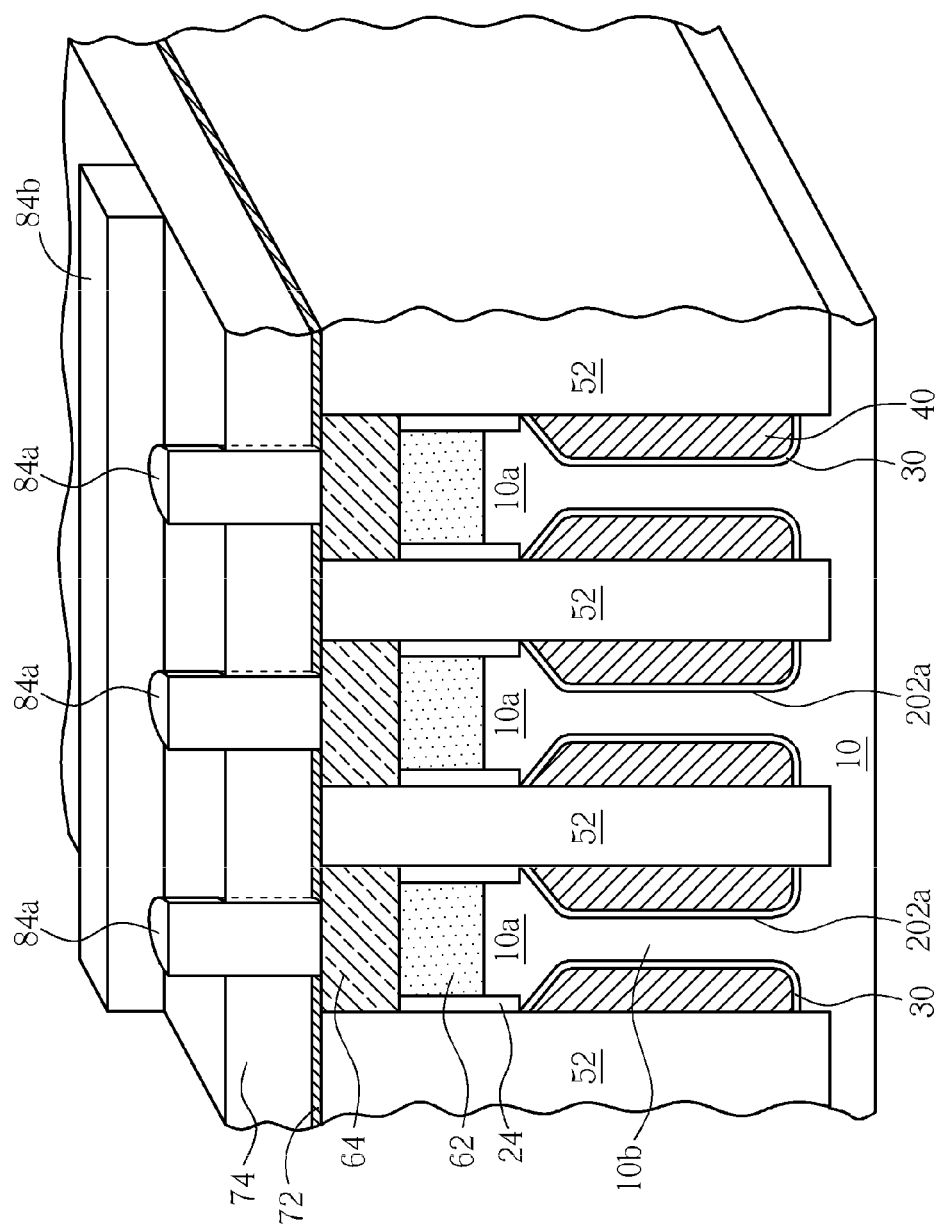

Referring to FIG. 13, after the formation of the capacitor contact openings 74a and bit line contact openings 74b, a metal layer (not explicitly shown) is deposited over the semiconductor substrate 10 in a blanket manner. The metal layer fills the capacitor contact openings 74a and bit line contact openings 74b. A conventional lithographic and etching process is then carried out to pattern the metal layer into rows of capacitor contact pillars 84a and bit line 84b. According to the embodiment of the invention, the metal layer, the capacitor contact pillars 84a and the bit line 84b may be made of Ti, TiN, W, or the like.

Figure 14:
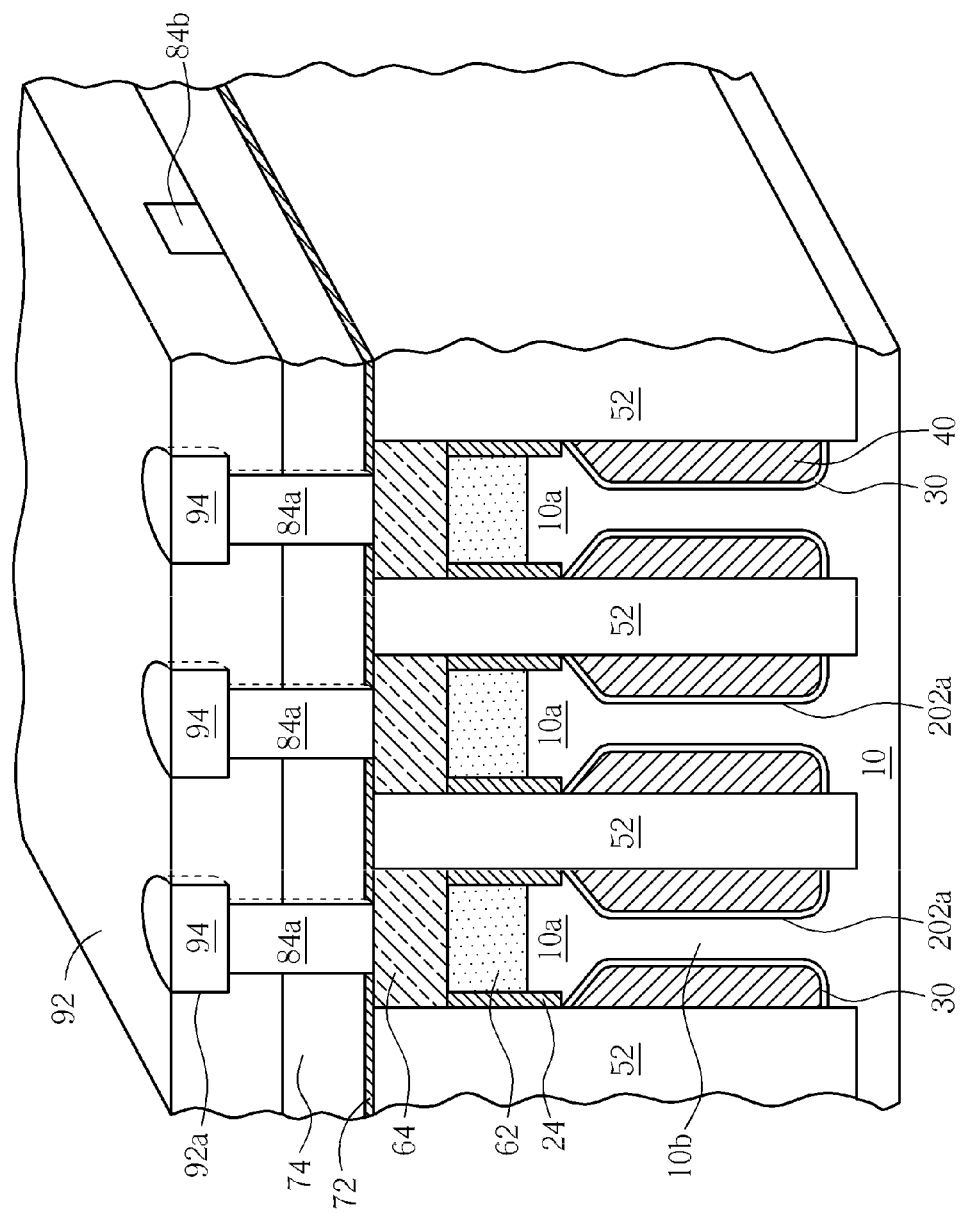

Referring to FIG. 14, after the formation of the capacitor contact pillars 84a and bit line 84b, a dielectric layer 92 is deposited over the semiconductor substrate 10 in a blanket manner to bury both the capacitor contact pillars 84a and bit line 84b. The dielectric layer 92 may be silicon oxide layer or phosphosilicate glass (PSG) and may be formed by chemical vapor deposition (CVD) methods. Subsequently, a conventional lithographic and etching process is carried out to form a plurality of landing pad openings 92a in the dielectric layer 92, wherein each landing pad opening 92a is disposed directly above each of the capacitor contact pillars 84a. Thereafter, a landing pad 94 is inlaid in each of the landing pad openings 92a and is electrically connected to the epitaxial silicon layer 64 through the capacitor contact pillar 84a. The landing pad 94 may comprises Ti, TiN, Ta, TaN, W, Cu, Au, or alloys thereof, but not limited thereto.

Figure 15:
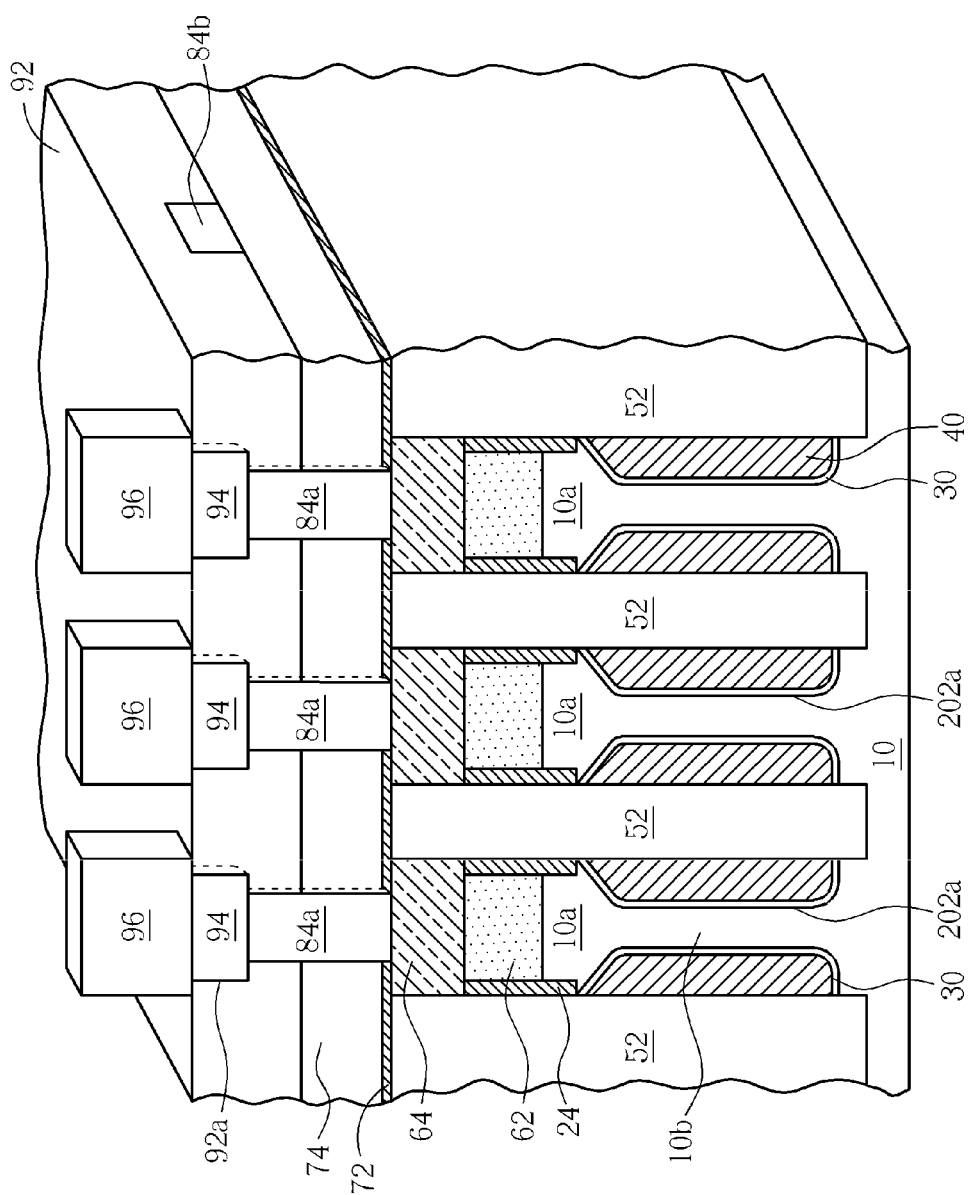

Referring to FIG. 15, after the formation of the landing pad 94, a storage capacitor 96 for storing electrical charge is stacked on the each of the landing pads 94. The storage capacitor 96 may comprise a bottom electrode or storage electrode, a capacitor dielectric layer and a top electrode, wherein the storage electrode is electrically connected to the landing pad 94 and one source/drain region of the selection transistor. It is understood that the storage capacitor 96 shown in FIG. 15 is for illustration purpose only and the storage capacitor 96 may be any other shape or any stack type capacitors known in the art.

Those skilled in the art will readily observe that numerous modifications and alterations of the device and method may be made while retaining the teachings of the invention.

What is claimed is:

1. A method for fabricating a memory cell array, comprising:
   providing a semiconductor substrate having thereon at least one pad layer;
   forming a plurality of first and second line-shaped trenches in parallel to one another in the semiconductor substrate;
   filling the first and second line-shaped trenches with first trench fill dielectric;
   forming a plurality of third line-shaped trenches into the semiconductor substrate, wherein the third line-shaped trenches intersect with the first and second line-shaped trenches, thereby forming a plurality of top silicon islands;
   forming a spacer on sidewall of the top silicon islands;
   etching, in a self-aligned manner, deep trenches into the semiconductor substrate through the third line-shaped trenches;
   etching a lower portion of each of the deep trenches to form a fin channel structure under each of the top silicon islands and a sidewall recess under the spacer;
   forming a gate dielectric layer on interior surface of the lower portion of each of the deep trenches;
   forming a sidewall buried word line inlaid in the sidewall recess;
   filling the deep trenches with second trench fill dielectric;
   stripping the pad layer to form a plurality of recessed implant windows;
   implanting dopants into the top silicon islands through the recessed implant windows, to thereby form source/drain regions; and
   forming bit lines and storage capacitors electrically connecting to corresponding said source/drain regions.

2. The method for fabricating a memory cell array according to claim 1 wherein each of the first line-shaped trenches is shallower than each of the second line-shaped trenches, and the first and second line-shaped trenches are alternately arranged.

3. The method for fabricating a memory cell array according to claim 2 wherein a depth of each of the first line-shaped trenches is about 80 nm below main surface of the semiconductor substrate.

4. The method for fabricating a memory cell array according to claim 1 wherein a curve-like channel region is defined around bottom of each of the first line-shaped trenches and an effective channel length is determined by a depth of the line-shaped trench.

5. The method for fabricating a memory cell array according to claim 1 wherein the second line-shaped trenches are cell insulator trenches.

6. The method for fabricating a memory cell array according to claim 5 wherein a depth of each of the second line-shaped trenches is about 200 nm below main surface of the semiconductor substrate.

7. The method for fabricating a memory cell array according to claim 1 wherein the spacer comprises silicon nitride.

8. The method for fabricating a memory cell array according to claim 1 wherein after implanting dopants into the top silicon islands, the method further comprises:
   growing an epitaxial layer atop each of the top silicon islands.

9. The method for fabricating a memory cell array according to claim 8 wherein the epitaxial layer is formed by selective epitaxial silicon growth process.

10. The method for fabricating a memory cell array according to claim 8 wherein the epitaxial layer is epitaxial silicon layer.

11. The method for fabricating a memory cell array according to claim 1 wherein the gate dielectric layer is formed by low-pressure radical oxidation (LPRO) method.

12. The method for fabricating a memory cell array according to claim 1 wherein the gate dielectric layer is formed by high-temperature oxide (HTO) deposition method.

13. The method for fabricating a memory cell array according to claim 1 wherein the sidewall buried word line comprises Ti, TiN, Ta, TaN, W, Cu or alloys thereof.

14. The method for fabricating a memory cell array according to claim 1 wherein the third line-shaped trenches are shallower than the first line-shaped trenches.

15. The method for fabricating a memory cell array according to claim 1 wherein when stripping the pad layer, an upper portion of the spacer are removed concurrently.

16. A transistor structure, comprising:
    a semiconductor substrate having a top surface and sidewalls extending downward from the top surface, wherein each of the sidewall comprises a vertical upper sidewall surface and a lower sidewall recess laterally etched into the semiconductor substrate;
    a first trench fill dielectric region inlaid into the top surface of the semiconductor substrate;
    two source/drain regions formed into the top surface of the semiconductor substrate and being sandwiched about the first trench fill dielectric region;
    a fin channel structure located around a bottom of the first trench fill dielectric region between the two source/drain regions;
    a U-shaped channel region located in the fin channel structure directly under the first trench fill dielectric region;
    a buried gate electrode embedded in the lower sidewall recess for controlling the channel region; and
    a gate dielectric layer formed on surface of the lower sidewall recess between the semiconductor substrate and the buried gate electrode.

17. The transistor structure according to claim 16 wherein a spacer is formed on the vertical upper sidewall surface.

18. The transistor structure according to claim 17 wherein the buried gate electrode is situated directly underneath the spacer.

19. The transistor structure according to claim 16 wherein the two source/drain regions and a body region in the semiconductor substrate lying below the two source/drain regions and the first trench fill dielectric region constitute an active zone of the transistor.

20. The transistor structure according to claim 16 wherein the fin channel structure has a fin channel width of about 20 nm.

21. The transistor structure according to claim 20 wherein each of two source/drain regions has a width that is greater than the fin channel width.

22. The transistor structure according to claim 20 wherein the width is 1F, wherein F is minimum feature size.

23. The transistor structure according to claim 16 wherein the transistor structure is isolated by a second trench fill dielectric region.

24. The transistor structure according to claim 16 wherein second trench fill dielectric region is deeper than the first trench fill dielectric region.

25. The transistor structure according to claim 24 wherein the first trench fill dielectric region has a depth of about 80 nm below the top surface of the semiconductor substrate.

26. The transistor structure according to claim 24 wherein the first trench fill dielectric region has a depth of about 200 nm below the top surface of the semiconductor substrate.

27. A memory cell, comprising:
    a stack type storage capacitor for storing electrical charge; and
    a transistor including all the limitations of claim 16 connected in series with the storage capacitor, wherein one the source/drain regions is connected to the storage capacitor and the other of the source/drain regions is connected to a bit line.

* * * * *